(12) United States Patent
Yamaguchi

(10) Patent No.: US 6,291,892 B1
(45) Date of Patent: Sep. 18, 2001

(54) SEMICONDUCTOR PACKAGE THAT INCLUDES A SHALLOW METAL BASIN SURROUNDED BY AN INSULATOR FRAME

(75) Inventor: Tadashi Yamaguchi, Tokyo (JP)

(73) Assignee: Oki Electric Industry Co., LTD, Tokyo (JP)

( * ) Notice: Subject to any disclaimer, the term of this patent is extended or adjusted under 35 U.S.C. 154(b) by 0 days.

(21) Appl. No.: 09/224,297

(22) Filed: Dec. 31, 1998

(30) Foreign Application Priority Data

Apr. 2, 1998 (JP) ................................................ 10-090138

(51) Int. Cl.$^7$ .......................... H01L 23/40; H01L 23/52; H01L 29/48
(52) U.S. Cl. .......................... 257/778; 257/676; 257/686; 257/730; 257/738
(58) Field of Search .......................... 257/676, 730–732, 257/778, 675, 774, 796, 737–838, 712–713, 719, 686, 777

(56) References Cited

U.S. PATENT DOCUMENTS

| | | | |
|---|---|---|---|
| 4,392,151 | * 7/1983 | Iwatani | 257/692 |
| 4,641,176 | * 2/1987 | Keryhuel et al. | 257/693 |
| 4,996,587 | 2/1991 | Hinrichsmeyer et al. | 257/676 |
| 5,583,377 | * 12/1996 | Higgins, III | 257/707 |
| 5,717,252 | * 2/1998 | Nakashima et al. | 257/707 |
| 5,798,564 | * 8/1998 | Eng et al. | 257/686 |
| 5,926,376 | * 7/1999 | Cho | 361/761 |
| 5,949,135 | * 9/1999 | Washida et al. | 257/685 |
| 5,977,633 | * 11/1999 | Suzuki et al. | 257/738 |

FOREIGN PATENT DOCUMENTS 8-125066 5/1996 (JP) .

* cited by examiner

Primary Examiner—Carl Whitehead, Jr.
Assistant Examiner—Jamie L. Brophy
(74) Attorney, Agent, or Firm—Rabin & Berdo, P.C.

(57) ABSTRACT

A semiconductor device provided with a shallow metal basin having a flange outwardly extending from the top edge of the side wall of the shallow metal basin, to receive a semiconductor device chip having one or more semiconductor device elements disposed therein and one or more bonding pads arranged thereon, an insulator frame having one or more external terminals arranged thereon, the external terminals being connected with the bonding pads, and the insulator frame being arranged on the flange of the shallow metal basin, and a plastic layer molded to cover the semiconductor device chip, resultantly realizing a semiconductor device packaged in a chip scale package of which the production procedure is simplified and the heat dissipation efficiency and the integration are remarkably improved.

10 Claims, 12 Drawing Sheets

SEMICONDUCTOR PACKAGE THAT INCLUDES A SHALLOW METAL BASIN SURROUNDED BY AN INSULATOR FRAME

FIELD OF THE INVENTION

This invention relates to an improvement applicable to a semiconductor device and a method for producing a semiconductor device. More specifically, this invention relates to an improvement applicable to a semiconductor device packaged in a chip scale package and a method for production thereof, the improvement being developed for the purpose to simplify the production procedure for producing a semiconductor device packaged in a chip scale package and to improve the heat dissipation efficiency and the integration of a semiconductor device packaged in a chip scale package.

BACKGROUND OF THE INVENTION

AND

PRIOR ART STATEMENT

When being put into practical services, a semiconductor device chip is usually packaged in a casket package or in a plastic molded package, for the purpose to be protected from external hazards including mechanical, chemical and radioactive ones. In order to satisfy an increasingly severer requirement for a compact and thinner semiconductor device, a semiconductor device packaged in a chip scale package was developed. One example thereof is disclosed in TOKU KAI HEI 8-125066 or JP-A 8-125066, the cross section thereof being copied in FIG. 1 attached hereto.

Referring to FIG. 1, a semiconductor device chip 1 having at least one semiconductor device element disposed therein and having plural bonding pads 2 arranged on the top surface thereof is provided with plural leads 3 each of which has a side view of an L-shape and each of which is adhered on the top surface of the semiconductor device chip 1. A hardened adhesive employed for adhering the leads 3 on the semiconductor device chip 1 is shown by a label 4 in the drawing. Each of the leads 3 is connected with each of the bonding pads 2 employing a bonding wire made of Au or the like. All the surfaces of the semiconductor device chip 1 is covered by a molded plastic layer 6, remaining tips 3A of the leads 3 uncovered. On the tips 3A, external terminals 7 made of a solder or the like are arranged, to be employed for connecting each of the foregoing leads 3 with each of wirings arranged on a printed circuit board (not shown) on which the foregoing semiconductor device packaged in a plastic molded package is scheduled to be mounted. FIG. 2 illustrates the rear surface of the packaged semiconductor device of which the cross section is illustrated in FIG. 1. As is clear from the drawings, the horizontal dimension of the packaged semiconductor device is not so larger than that of the semiconductor device chip proper 1. The thickness of the packaged semiconductor device is small as well, because the thickness of the molded plastic layer 6 is not so large.

Unfortunately, however, the packaged semiconductor device of which the cross section is illustrated in FIG. 1 is involved with a drawback in which the production procedure is complicated particularly for the steps for producing the leads 3 having a side view of an L-shape. The other drawback accompanying the packaged semiconductor device of which the cross section is illustrated in FIG. 1 is a less sufficient grade of heat dissipation efficiency which is caused by a rather thick plastic layers covering the semiconductor device chip 1.

OBJECTS AND SUMMERY OF THE INVENTION

Accordingly, an object of this invention is to provide a semiconductor device packaged in a chip scale package of which the production procedure is simple and the heat dissipation efficiency is improved.

An additional object of this invention is to provide a semiconductor device packaged in a chip scale package wherein the integration is remarkably improved.

The other object of this invention is to provide a method for producing a semiconductor device packaged in a chip scale package of which the production procedure is simple and the heat dissipation efficiency and the integration are improved.

To achieve the first one of the foregoing objects, a semiconductor device in accordance with a first embodiment of this invention is based on a concept that the plural leads 3 each of which has a side view of an L-shape which were essential for the semiconductor device packaged in a chip scale package available in the prior art and which is illustrated in FIG. 1 are replaced by plural bonding pads 11 arranged on an insulator frame 12 further arranged on a flange 8B extending from the top edge of a side wall 8C rising from the external edge of a bottom plate 8A of a shallow metal basin 8 for the purpose to remove the complicated procedure for producing the L-shaped leads 3 which were essential for the semiconductor device available in the prior art and which is illustrated in FIG. 1, for the ultimate purpose to simplify the production process, and the molded plastic bottom and side plates of the semiconductor device packaged in a chip seal package available in the prior art are replaced by a shallow metal basin, for the purpose to improve the heat dissipation efficiency, for the ultimate purpose to improve the operation speed of the semiconductor device of the first embodiment of this invention.

As a result, a semiconductor device in accordance with the first embodiment of this invention can be described as a semiconductor device provided with a shallow metal basin having a flange outwardly extending from the top edge of the side wall of the shallow metal basin, to receive a semiconductor device chip having one or more semiconductor device elements disposed therein and one or more bonding pads arranged thereon, an insulator frame having one or more external terminals arranged thereon, the external terminals being connected with the bonding pads, and the insulator frame being arranged on the flange of the shallow metal basin, and a plastic layer molded to cover the semiconductor device chip.

To achieve the first one of the foregoing objects, a semiconductor device in accordance with a second embodiment of this invention is based on a concept that the foregoing insulator frame 12 has a structure to be fitted to the side wall of the foregoing shallow metal basin 10 and the foregoing metal balls 16 are replaced by pairs of external terminals consisting of an upper conductor piece and a lower conductor piece connected with each other by a conductor layer g a through-hole penetrating the insulator frame for the purpose to remove a welding or soldering process for the ultimate purpose to simply the production procedure and to introduce versatility for the production process for producing a semiconductor device in accordance with the second embodies of this invention.

As a result, a semiconductor device in accordance with the second embodiment of this invention can be described as a semiconductor device provided with a shallow metal basin having a flange outwardly extending from the top edge of the side wall of the shallow metal basin, to receive a semiconductor device chip having one or more semiconductor device elements disposed therein and one or more bonding pads arranged thereon, an insulator frame having one or more pairs of external terminals consisting of an upper conductor piece and a lower conductor piece connected with each other by a conductive layer lining a through-hole vertically penetrating the insulator frame, the internal closed surface of the insulator frame being fitted to the external closed surface of the side wall of the shallow metal basin, and a plastic layer molded to cover the semiconductor device chip.

To increase the grade of integration, the semiconductor devices in accordance with the second embodiment of this invention can be piled.

As a result, a semiconductor device in accordance with the third embodiment of this invention can be described as a semiconductor device having a plurality of the semiconductor devices in accordance with the second embodiment of this invention, the semiconductor devices in accordance with the second embodiment of this invention being piled employing solder balls 16, which intervene between the lower pieces of the external terminals of the upper one of the semiconductor device to be piled and the upper pieces of the external terminals of the lower one of the semiconductor device to be piled.

To improve the heat dissipation efficiency, the semiconductor device in accordance with the second embodiment of this invention can be provided with plural solder balls which will be converted to a solid bulk of a solder by melting the plural solder balls and hardening the same, for the purpose to allow the solid bulk of the solder to act as a heat sink.

To increase the grade of integration, the semiconductor device in accordance with a fifth embodiment of this invention is provided with an insulator frame having a larger thickness to accept two semiconductor device chip complexes each of which semiconductor device chip complexes is a semiconductor device chip adhered on a shallow metal basin, the two semiconductor device chip complexes being arranged in a back-to-back position.

To further increase the grade of integration, the semiconductor device in accordance with the third embodiment of this invention can be piled.

For the same purpose, the semiconductor device in accordance with the fifth embodiment of this invention and the third embodiment of this invention can be piled.

To achieve the second one of the foregoing objects, a method for producing a semiconductor device in accordance with this invention can be described as a method for producing a semiconductor device including a step for producing a shallow metal basin having a flange outwardly extending from a top edge of a side wall of the shallow metal basin, a step for adhering a semiconductor device chip having at least one semiconductor device element disposed therein and at least one bonding pad arranged therein on a bottom plate of the shallow metal basin, a step for producing an insulator frame having at least one bonding pad arranged thereon, the insulator frame having a horizontal shape corresponding to a shape of the flange of the shallow metal basin, a step for adhering the insulator frame on the flange of the shallow metal basin, a-step for connecting the at least one bonding pad arranged on the semiconductor devise chip and the at least one bonding pad arranged on the insulator frame, and a step for covering the semiconductor devise chip and a part of the at least one bonding pad arranged on the insulator frame with a resin cover, employing a molding process.

To achieve the second one of the foregoing objects, the other method for producing a semiconductor device in accordance with this invention can be described as a method for producing a semiconductor device including a step for producing a shallow metal basin having a flange outwardly extending from a top edge of a side wall of the shallow metal basin, a step for adhering a semiconductor device chip having at least one semiconductor device element disposed therein and at least one bonding pad arranged therein on a bottom plate of the shallow metal basin, a step for producing an insulator frame having at least one bonding pad arranged thereon, the at least one bonding pad arranged on the insulator frame being connected with a corresponding bonding pad arranged along a rear surface of the insulator frame through a conductor layer lining a through-hole penetrating the insulator frame, a step for fitting an internal closed surface of the insulator frame to the side wall of the shallow metal basin, a step for connecting the at least one bonding pad arranged on the semiconductor devise chip and the at least one bonding pad arranged on the insulator frame, and a step for covering the semiconductor devise chip and a part of the at least one bonding pad arranged one the insulator frame with a resin cover, employing a molding process.

BRIEF DESCRIPTION OF THE DRAWINGS

This invention, together with the various features and advantages, can be readily understood from the following more detailed description presented in conjunction with the following drawings, in which.

DETAILED DESCRIPTION OF THE PREFERRED EMBODIMENTS OF THIS INVENTION

Referring to drawings, semiconductor devices packaged in a chip scale package in accordance with seven independent embodiments of this invention will be described below.

FIRST EMBODIMENT

A semiconductor device provided with a shallow metal basin having a flange outwardly extending from the top edge of the side wall of the shallow metal basin, to receive a semiconductor device chip having one or more semiconductor device elements disposed therein and one or more bonding pads arranged thereon, an insulator frame having one or more external terminals arranged thereon, the external terminals being connected with the bonding pads, and the insulator frame being arranged on the flange of the shallow metal basin, and a plastic layer molded to cover the semiconductor device chip.

Figure 3:
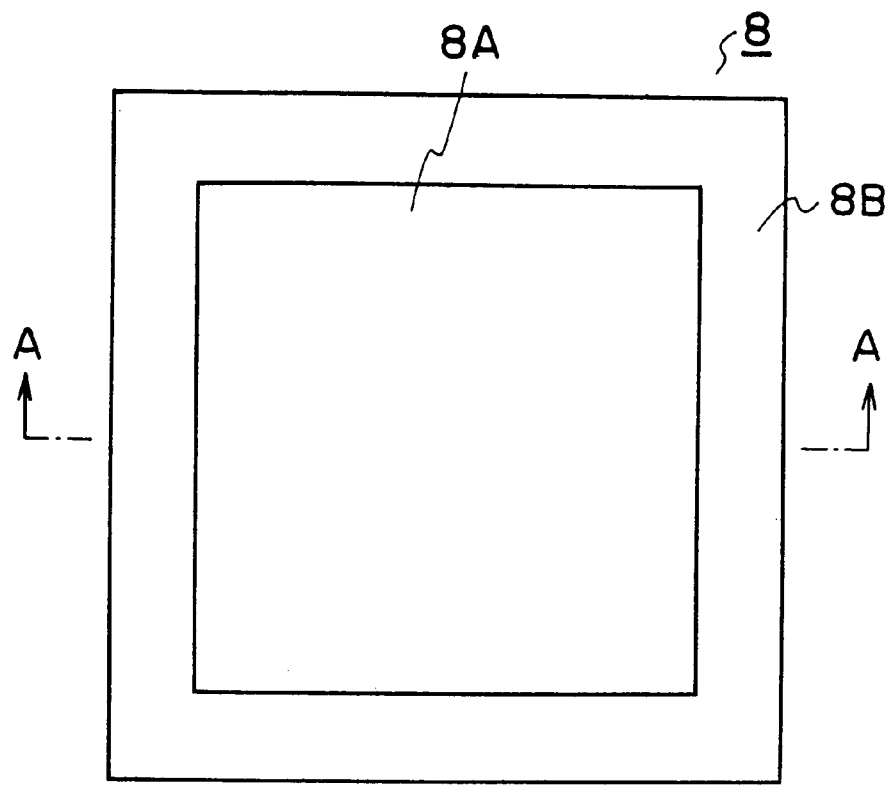
FIG. 3 is a plan view of a shallow metal basin employable for producing a semiconductor device packaged in a chip scale package in accordance with this invention.

Referring to FIG. 3, a forming press is employed to produce a shallow metal basin 8 having a flange 8B outwardly extending from an annular top edge of a cylindrical side wall 8C (see FIG. 4 as well) surrounding the metal bottom plate 8A of the shallow metal basin 8. Thus, the basin 8 has a protrusion on one side, and a recess on the other. An endless tape of Cu and 42 alloy can be included in exemplary materials for the shallow metal basin 8, for the purpose of enabling a continuous production process to be employable.

Figure 4:
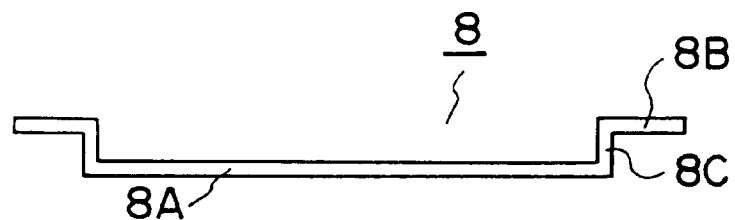
FIG. 4 is a cross section of a shallow metal basin employable for producing a semiconductor device packaged in a chip scale package in accordance with this invention, the cross section being taken along line A—A shown in FIG. 3.

Referring to FIG. 4 illustrating the cross section of the shallow metal basin 8 taken along line A—A shown in FIG. 3, exemplary dimension of the shallow metal basin 8 is 15 through 20 mm×15 through 20 mm×0.3 through 0.5 mm (thickness). The width of the flange 8B is e.g. 1.00 through 2.00 mm and the thickness of the shallow metal basin 8 is e.g. 0.1 through 0.15 mm.

Figure 5:
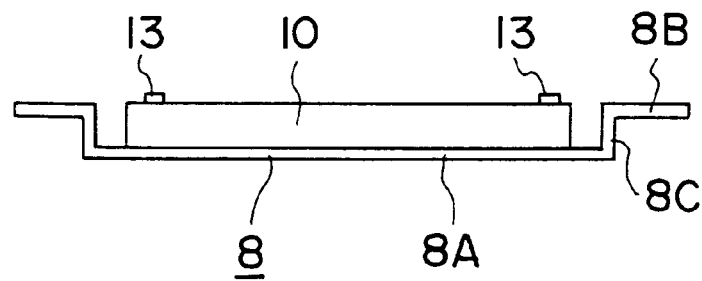
FIG. 5 is a cross section of a semiconductor device chip adhered on a shallow metal basin employable for producing a semiconductor device packaged in a chip scale package in accordance with this invention.

Referring to FIG. 5, a semiconductor device chip 10 having at least one semiconductor device element disposed therein and plural bonding pads 13 arranged along the periphery thereof is adhered on the bottom surface of the bottom plates 8A of the shallow metal basin 8 in an upright position.

A dicing process can be conducted at this stage to put each of the shallow metal basins 8 into an individual piece, Since a collective and continuous process is advantageous, however, efforts will be used to delay the dicing process as late as possible. In this example, a dicing process is scheduled to be conducted after a molding process is finished.

Figure 6:
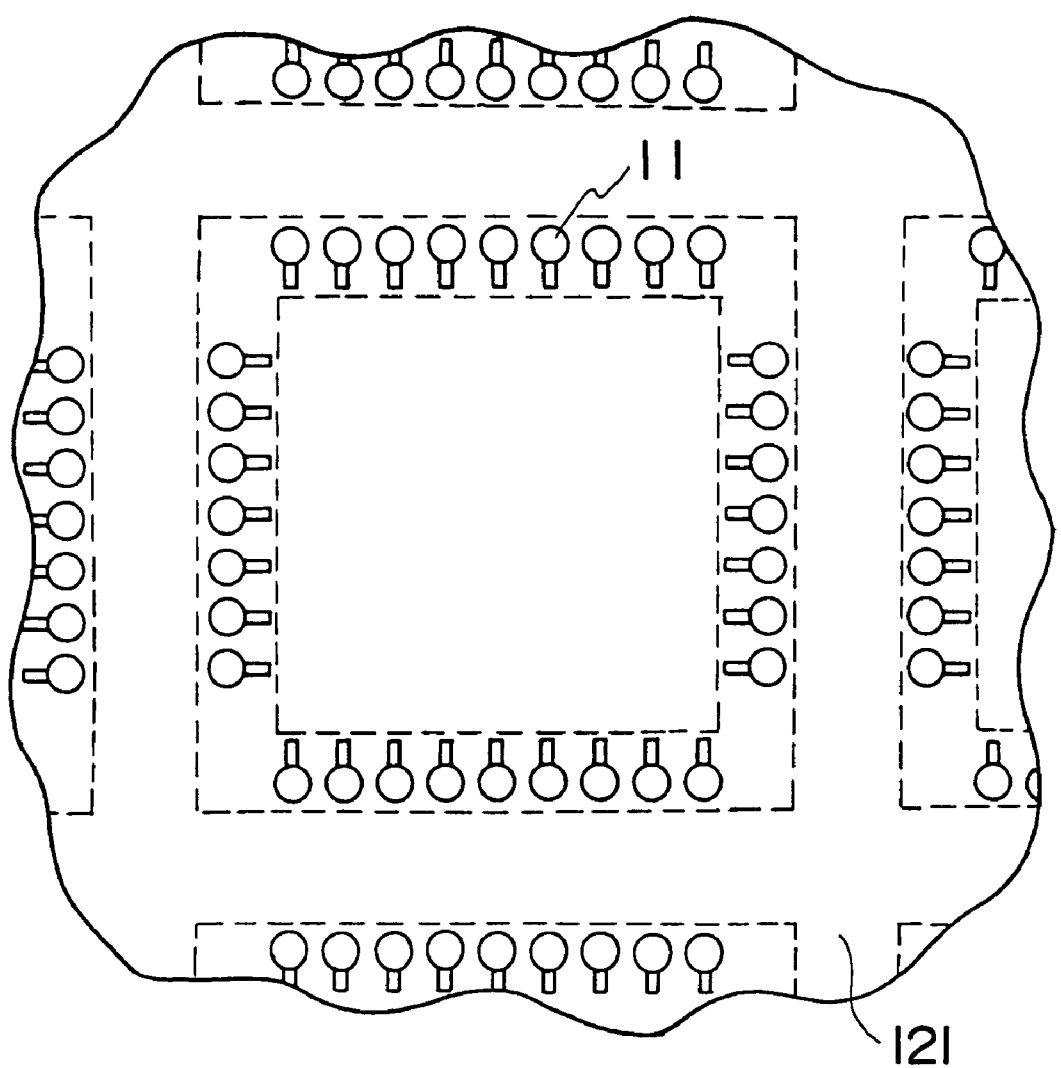
FIG. 6 is a plan view of an endless tape of a metal foil arranged on an endless insulator plate for producing a plurality of insulator frames on which a series of bonding pads are arranged, the insulator frames on which a series of bonding pads are arranged being employable for producing a semiconductor device packaged in a chip scale package in accordance with this invention.

Referring to FIG. 6, an endless tape of a Cu foil having an exemplary thickness of 25 μm is extended on an endless insulator plate 121 made of e.g. a glass epoxy resin and having an exemplary thickness of 0.1 through 0.2 mm, before a selective etching process is conducted to remain the Cu foil in a pattern representing a series of bonding pads 11 each of which has a horizontal shape of a combination of a rectangle and a circle, on the endless insulator plate 121. The rectangle is scheduled to receive a bonding wire connecting with the bonding pad 13 of the semiconductor device chip 10 and the circle is scheduled to receive a solder ball 16 referred to later. Each of the broken lines surrounding the series of bonding pads 11 respectively corresponds to the internal edge and the external edge of the flange 8B of the shallow metal basin 8.

Figure 7:
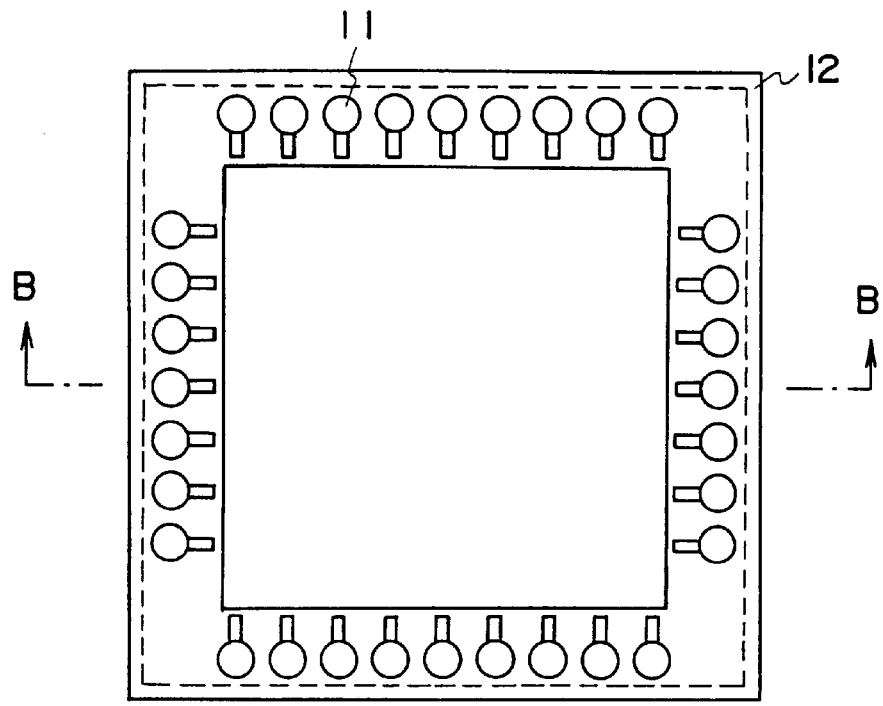
FIG. 7 is a plan view of an insulator frame on which a series of bonding pads are arranged and which is employable for producing a semiconductor device in accordance with this invention.

Referring to FIG. 7, a dicing process is conducted to put each of the glass epoxy resin frames 12 having bonding pads 11 thereon, into a separate piece.

Figure 8:
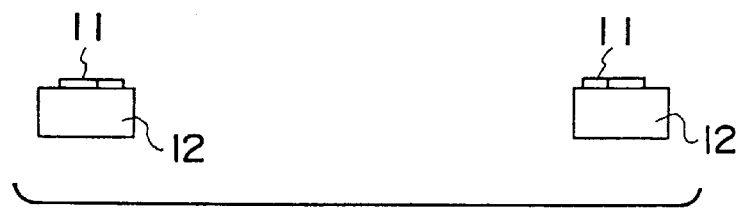
FIG. 8 is a cross section of an insulator frame on which a series of bonding pads are arranged and which is employable for producing a semiconductor device in accordance with this invention, the cross section being taken along line B—B shown in FIG. 7.

Referring to FIG. 8 illustrating the cross section of the glass epoxy resin frames 12 taken along B—B line shown in FIG. 7, the glass epoxy resin frame 12 has bonding pads 11 arranged thereon.

Figure 9:
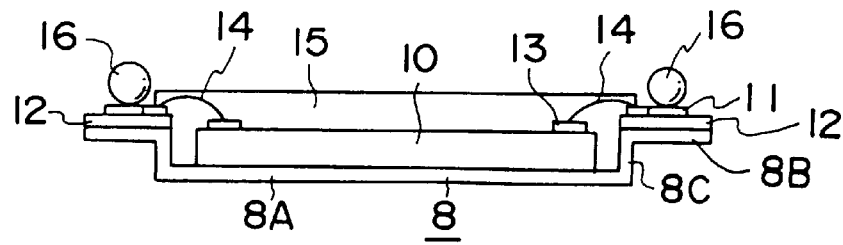
FIG. 9 is a cross section of a semiconductor device packaged in a chip scale package in accordance with the first embodiment of this invention.
Figure 10:
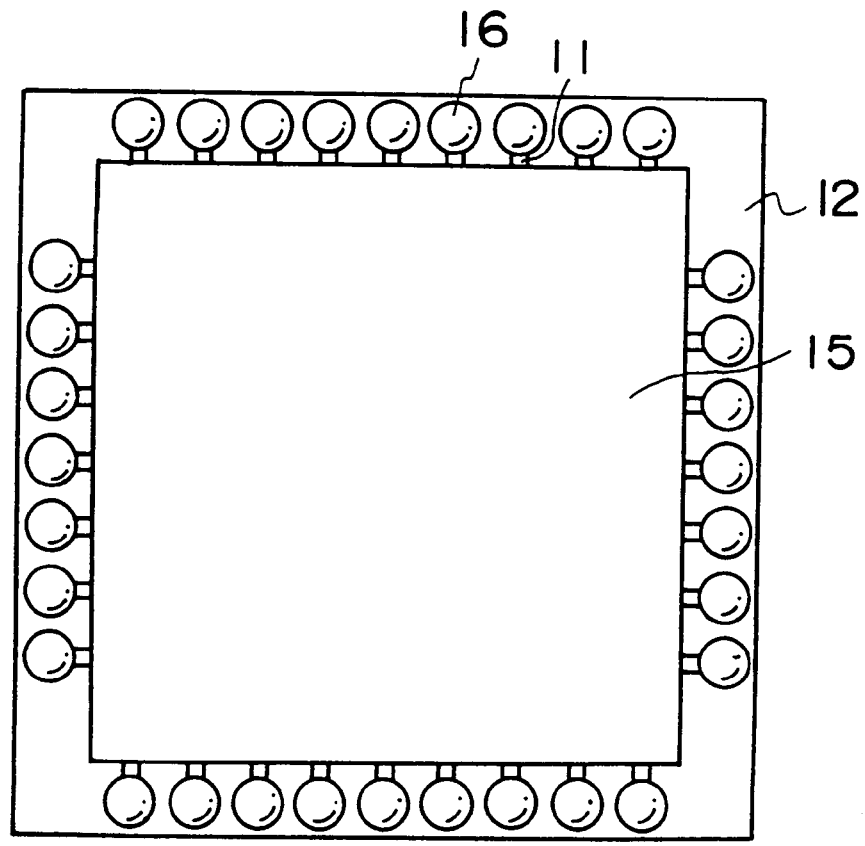
FIG. 10 is a plan view of a semiconductor device packaged in a chip scale package in accordance with the first embodiment of this invention.

Referring to FIGS. 9 and 10, the glass epoxy resin frame 12 is adhered on the flange 8B of the shallow metal basin 8.

A wire bonding process is conducted to connect each of the bonding pads 13 and each of the bonding pads 11 employing a bonding wire 14 made of Au et al.

A screen printing process or the like is employed to arrange a series of solder balls 16 to cause each of the solder balls 16 to contact with each of the bonding pads 11.

A molding process is conducted to cover the top surface of the semiconductor device chip 10 and the periphery thereof with resin 15 excluding the solder balls 16. A dicing process is conducted to sever each of the packaged semiconductor devices from the endless tape of Cu or 42 alloy. This dicing process is unnecessary, if a dicing process was conducted after the semiconductor device elements were put on the shallow metal basins 8.

In the foregoing manner, a semiconductor device packaged in a chip scale package of which the production procedure is simple and the heat dissipation efficiency is improved, in accordance with the first embodiment of this invention has been produced.

Figure 11:
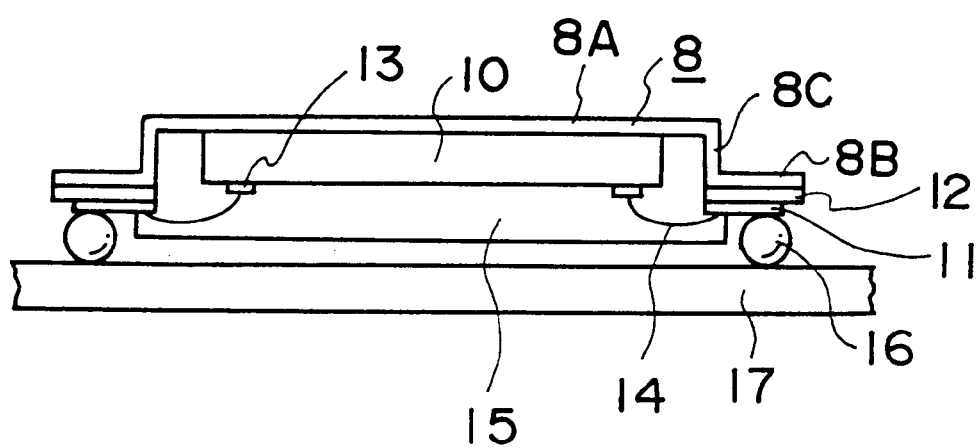
FIG. 11 is a cross section of a semiconductor device packaged in a chip scale package in accordance with the first embodiment of this invention, the semiconductor device being under a position in which it is put into practical services.

Referring to FIG. 11, when the semiconductor device in accordance with the first embodiment of this invention is put into practical services, the semiconductor device is placed on a printed circuit board 17 in a face down position wherein each of the solder balls 16 contacts with each of the printed terminals (not shown) of the printed circuit board 17.

The advantages of the semiconductor device packaged in a chip scale package in accordance with the first embodiment of this invention are itemized below.

Figure 1:
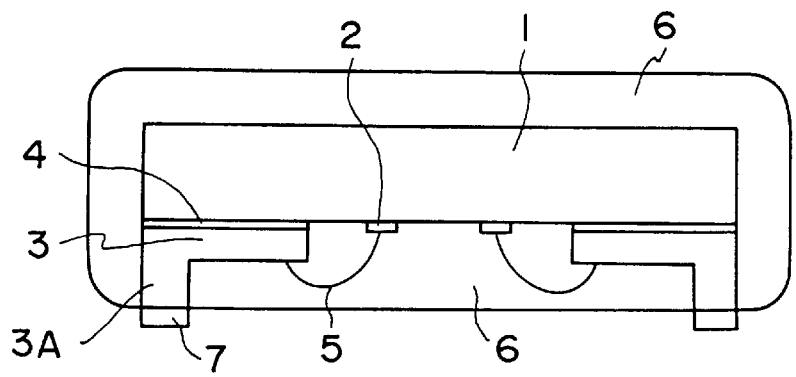
FIG. 1 is a cross section of a semiconductor device packaged in a chip scale package, available in the prior art.
Figure 2:
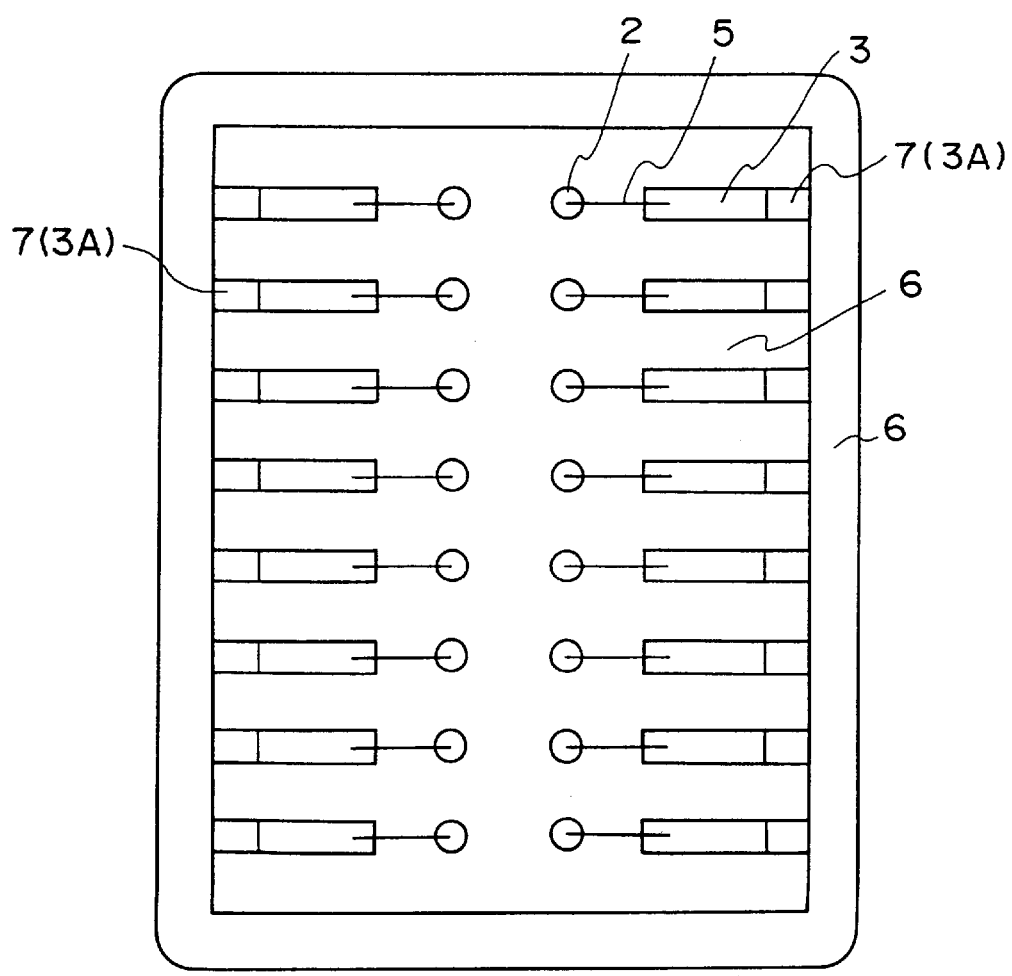
FIG. 2 is a rear view of a semiconductor device packaged in a chip scale package, available in the prior out, of which the cross section is illustrated in FIG. 1.

1 Since the plural leads 3 each of which has a side view of an L-shape which were essential for the semiconductor device packaged in a chip scale package available in the prior art and which is illustrated in FIG. 1 are replaced by the plural bonding pads 11 arranged on the glass epoxy resin frame 12 further arranged on the flange 8B extending from the bottom plate 8A of the shallow metal basin 8, in the first embodiment of this invention, the complicated procedure for producing the L-shaped leads 3 are entirely removed from the method for producing a semiconductor device packaged in a chip scale package in accordance with the first embodiment of this invention, resultantly remarkably simplifying the production process of the semiconductor device packaged in a chip scale package in accordance with the first embodiment of this invention.

2 Since the molded plastic bottom and the molded plastic side plates of the semiconductor device packaged in a chip scale package available in the prior art, are replaced by the shallow metal basin, the heat dissipation efficiency is remarkably improved for the semiconductor device packaged in a chip scale package in accordance with the first embodiment of this invention, resultantly improving the operation speed of the semiconductor device packaged in a chip scale package in accordance with the first embodiment of this invention.

SECOND EMBODIMENT

A semiconductor device provided with a shallow metal basin having a flange outwardly extending from the top edge of the side wall of the shallow metal basin, to receive a semiconductor device chip having one or more semiconductor device elements disposed therein and one or more bonding pads arranged thereon, an insulator frame having one or more pairs of external terminals consisting of an upper conductor piece and a lower conductor piece connected with each other by a conductor layer lining a through-hole vertically penetrating the insulator frame, the internal closed surface of the insulator frame being fitted to the external closed surface of the side wall of the insulator frame, and a plastic layer molded to cover the semiconductor device chip.

Referring to FIGS. 3 and 4 again, a forming press is employed to produce a shallow metal basin 8 having a flange 8B outwardly extending from an annular top edge of a cylindrical side wall 8C surrounding the bottom plate 8A of the shallow metal basin 8. Cu or 42 alloy can be a material of the shallow metal basin 8. The only difference between the shallow metal basins 8 employable for the first embodiment and the shallow metal basins 8 employable for this embodiment is that the width of the flange 8B is as short as 0.2 through 0.3 mm, and a continuous production process can not be employed for the second embodiment.

Referring to FIG. 5 again, a semiconductor device chip 10 having at least one semiconductor device element disposed therein and plural bonding pads 13 arranged along the periphery thereof is adhered on the bottom surface of the bottom plate 8A of the shallow metal basin 8, in an upright position.

Figure 12:
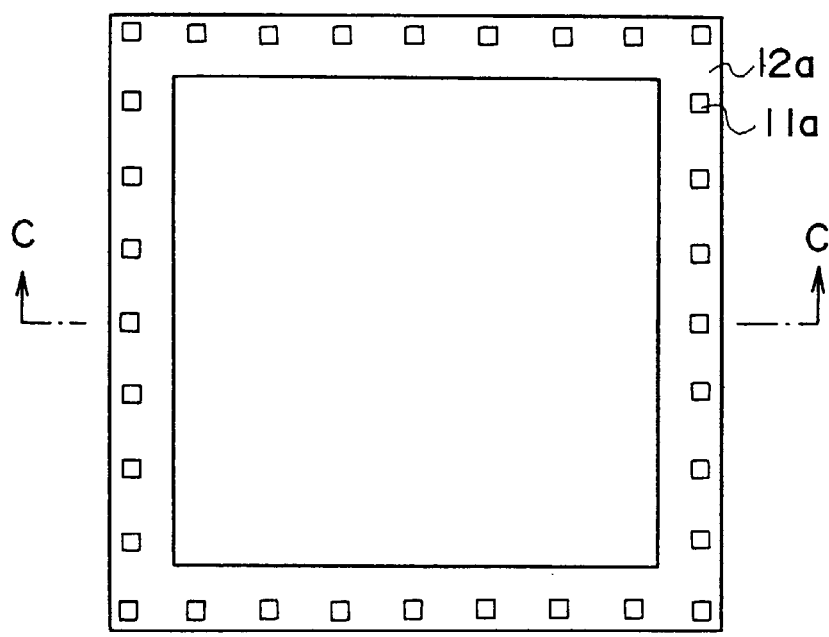
FIG. 12 is a plan view of an insulator frame on which a series of bonding pads are arranged and which is employable for producing a semiconductor device in accordance with the second embodiments of this invention or each of the embodiment of this invention having a larger ordinal as the number thereof.
Figure 13:
FIG. 13 is a cross section of an insulator frame on which a series of bonding pads are arranged and which is employable for producing a semiconductor device in accordance with the second embodiment of this invention or each of the embodiments of this invention having a larger ordinal as the number thereof, the cross section being taken along line C—C shown in FIG. 12.

Referring to FIG. 12 and to FIG. 13 illustrating a cross section taken along line C—C shown in FIG. 12, an insulator frame 12a made of a glass epoxy resin et al. having a pair of an upper metal piece 11a and a lower metal piece 11a connected with each other by a metal layer 11b lining a through-hole 11, is produced. The exemplary thickness of the insulator flange 12a is 0.3 through 0.5 mm. The dimension of the internal closed surface of the insulator flange 12a is slightly less than that of the external closed surface of the side wall 8c of the shallow metal basin 8, because the shallow metal basin 8 is scheduled to be fitted to the insulator frame 12a. A process for producing the insulator frame 12a includes a step for producing a plurality of through-holes at a location corresponding to the external terminals arranged along the insulator flange 12a, a step for depositing a metal at selected locations along the upper and lower surfaces of the insulator frame 12a and the internal surfaces of the through-holes to produce metal layers 11b lining the through-holes, and a dicing step to put each of the insulator frames 12a into a separate piece.

Figure 14:
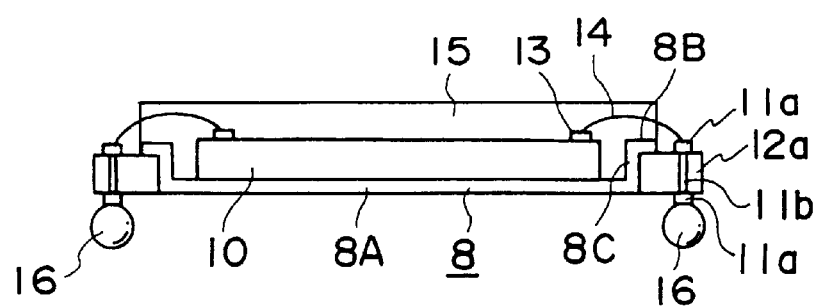
FIG. 14 is a cross section of a semiconductor device packaged in a chip scale package in accordance with the second embodiment of this invention.

Referring to FIG. 14, the shallow metal basin 8 is fitted to the insulator frame 12a, before a semiconductor device chip 10 is adhered on the bottom plate 8a of the shallow metal basin 8, a bonding process is conducted to connect each of the bonding pads 13 arranged on the semiconductor device chip 10 and each of the upper conductor pieces 11a of the external terminals, each of which is further connected with each of the lower conductor pieces 11a connected by each of the conductor layers 11b lining each of the through-holes, a screen printing process or the like is conducted to arrange a series of solder balls 16 to cause each of the solder balls 16 to contact with each of the bonding pads 11, and a molding process is conducted to cover the top surface of the semiconductor device chip 10 and the periphery thereof with resin 15.

In the foregoing manner, a semiconductor device packaged in a chip scale package of which the production process is versatile, in addition to that in which the production process is simple, in accordance with the second embodiment of this invention, has been produced.

Figure 15:
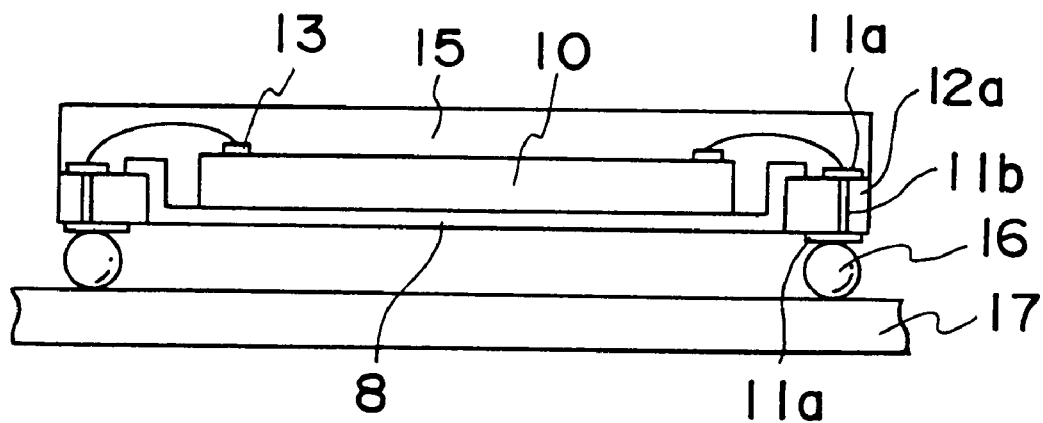
FIG. 15 is a cross section of a semiconductor device packaged in a chip scale package in accordance with the second embodiment of this invention, the semiconductor device being under a position in which it is put into practical services.

Referring to FIG. 15, when the semiconductor device in accordance with the second embodiment of this invention is put into practical services, the semiconductor device is placed in an upright position on a printed circuit board 17 wherein each of the solder balls 16 contacts each of bonding pads (not shown) of the printed terminals of the printed circuit board 17.

The advantages of the semiconductor device packaged in a chip scale package in accordance with the second embodiment of this invention are itemized below.

1 Since the plural leads 3 each of which has a side view of an L-shape which were essential for the semiconductor device available in the prior art and which is illustrated in FIG. 1 are replaced by the plural bonding pads 11*a* arranged on the glass epoxy resin frame 12 which is fitted to the side wall 8C of the shallow metal basin 8, in the second embodiment of this invention, the complicated procedure for producing the L-shaped leads 3 are entirely removed from the method for producing the semiconductor device in accordance with the first embodiment of this invention, resultantly remarkably simplifying the production process of the semiconductor device in accordance with the first embodiment of this invention.

2 Since the shallow metal basin 8 is neither welded nor soldered to the insulator frame 12*a*, the production process is versatile, in addition to that in which it is simple. In other words, if a semiconductor device chip 10 is determined to be a faulty one and it is required to be replaced by another faultless chip 10, such a requirement can readily be satisfied.

3 Since the molded plastic bottom and side plates of the semiconductor device available in the prior art are replaced by a shallow metal basin, the heat dissipation efficiency is remarkably improved for the semiconductor device in accordance with the second embodiment of this invention, resultantly improving the operation speed of the semiconductor device in accordance with the second embodiment of this invention.

THIRD EMBODIMENT

A semiconductor device having a plurality of the semiconductor devices in accordance with the second embodiment of this invention, the semiconductor devices in accordance with the second embodiment of this invention being piled employing solder balls 16 which intervene between the lower pieces of the external terminals of the upper one of the semiconductor device to be piled and the upper pieces of the external terminals of the lower one of the semiconductor device to be piled.

Figure 16:
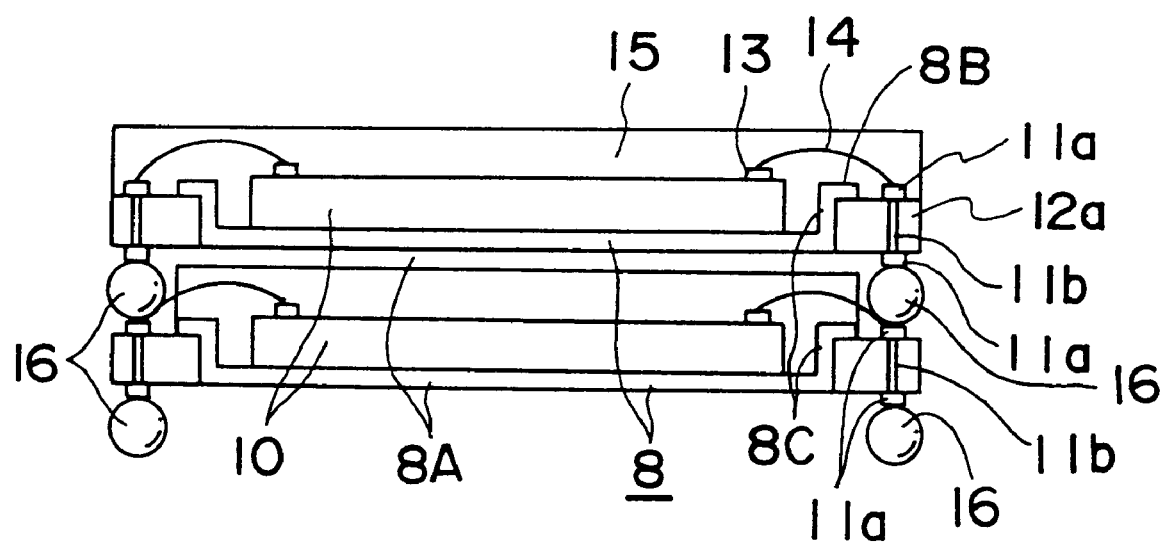
FIG. 16 is a cross section of a semiconductor device packaged in a chip scale package in accordance with the third embodiment of this invention.

Referring to FIG. 16, the semiconductor devices in accordance with the second embodiment of this invention illustrated in FIG. 14 are piled employing solder balls 16 which intervene between the lower pieces of the external terminals of the upper one of the semiconductor device to be piled and the upper pieces of the external terminals of the lower one of the semiconductor device to be piled. The solder balls 16 of the lowest layer contact with the printed circuit of the printed circuit board 17, while those of the other layers (the second and higher layers from the bottom) are connected with the corresponding ones of the lower layers.

It is noted that the quantity of the external terminals is limited, excepting the cases in which the semiconductor device is a memory which can be a combination of parallel circuits.

Needless to emphasize, an advantage of this embodiment is an improved grade of integration which is realized by piling plural semiconductor devices, wherein a horizontal dimension for more than one semiconductor device chip is not required for accommodating plural semiconductor devices, in addition to the advantages inherent to this invention and which were described for the first and second embodiments of this invention.

FOURTH EMBODIMENT

A semiconductor device in accordance with the second embodiment of this invention further provided with a plurality of solder balls arranged along the rear surface of the bottom plate of the shallow metal basin, for the ultimate purpose to convert the plurality of solder balls into a solid bulk of the solder by melting them and hardening them again, to allow the solid bulk of the solder to act as a heat sink and as a member to cause the shallow metal basin to contact with a printed circuit board on which the semiconductor device in accordance with the fourth embodiment of this invention is arranged.

Figure 17:
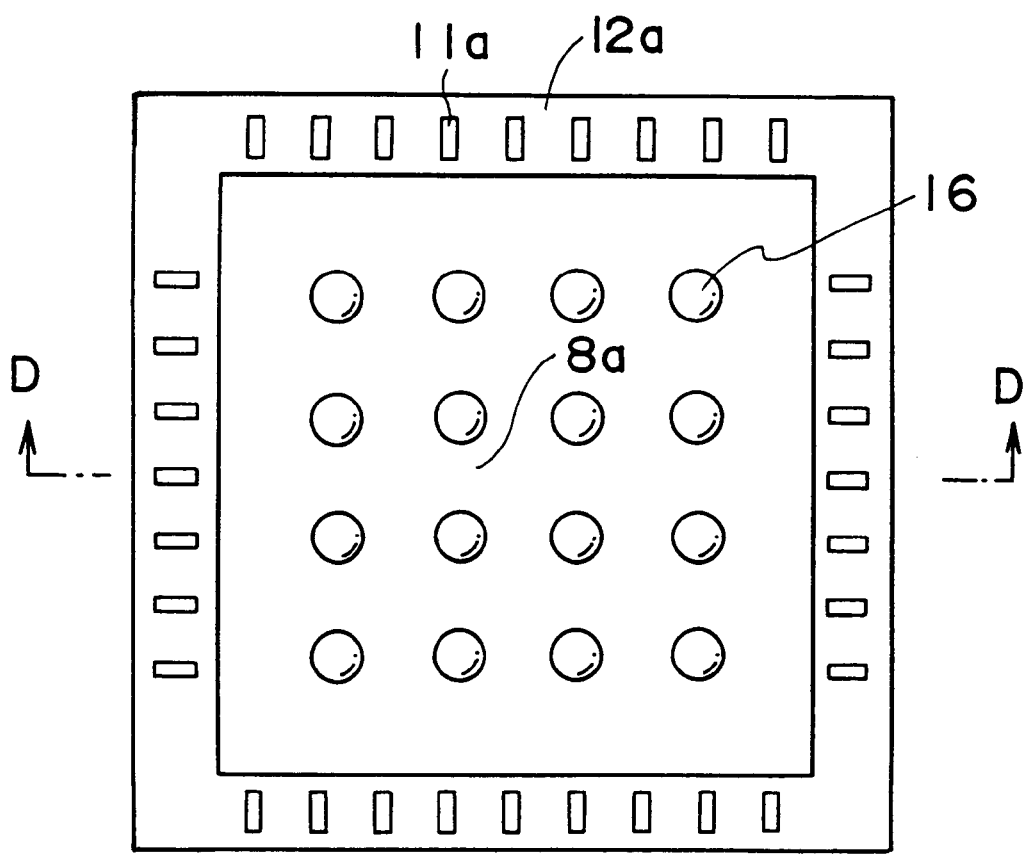
FIG. 17 is a rear view of a semiconductor device packaged in a chip scale package in accordance with the fourth embodiment of this invention.
Figure 18:
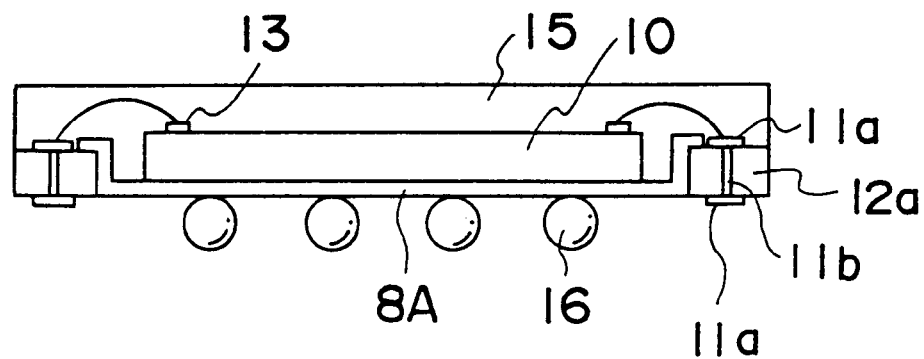
FIG. 18 is a cross section of a semiconductor device packaged in a chip scale package in accordance with the fourth embodiment of this invention, the cross section being taken along line D—D shown in FIG. 17.

Referring to FIG. 17 and to FIG. 18 illustrating a cross section taken along line D—D shown in FIG. 17, a plurality of solder balls 16 are arranged along the rear surface of the bottom plate 8*a* of the shallow metal basin 8. FIG. 17 is a rear view of the semiconductor device in accordance with the fourth embodiment of this invention and FIG. 18 is a cross section of the semiconductor device in accordance with the fourth embodiment of this invention taken along lines D—D shown in FIG. 17.

Figure 19:
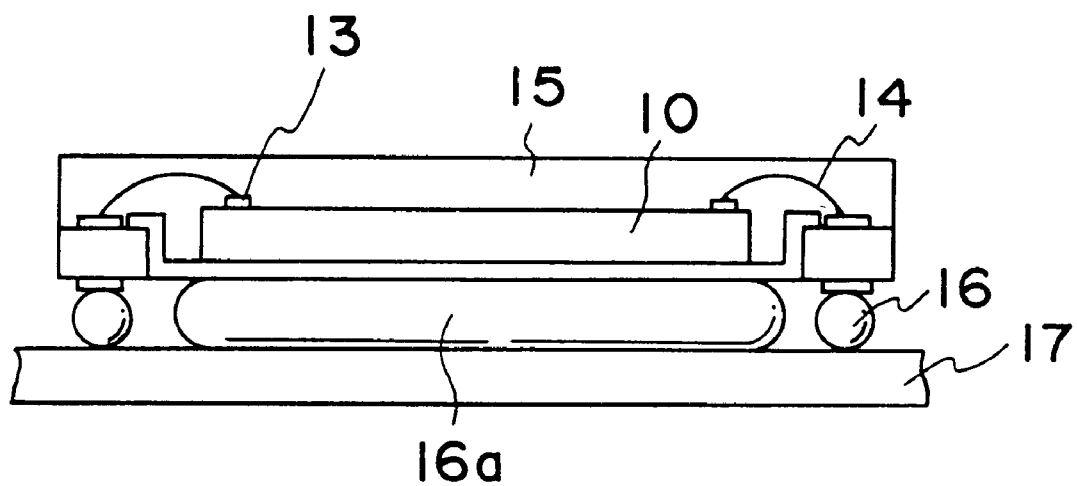
FIG. 19 is a cross section of a semiconductor device packaged in a chip scale package in accordance with the fourth embodiment of this invention, the semiconductor device being under a position in which it is put into practical services.

Referring to FIG. 19, the solder balls 16 are melted and hardened again to convert the solder balls 16 into a solid bulk of the solder 16*a* during a process for mounting the semiconductor device on a printed circuit board 17. The solid bulk of the solder 16*a* acts as a heat sink and as a member to connect the bottom plate 8*a* of the shallow metal basin 8 and the printed circuit board 17.

FIFTH EMBODIMENT

A semiconductor device provided with two shallow metal basins having a flange outwardly extending from the top edge of the side wall of the metal basin, to receive a semiconductor device chip having one or more semiconductor device elements disposed therein and one or more bonding pads arranged thereon, the two shallow metal basins being arranged to cause each of the bottom plates thereof to face each other, and the two metal basins being fitted to a thick insulator frame having one or more pairs of external terminals consisting of an upper conductor piece and a lower conductor piece connected with each other by a conductor piece lining a through-hole vertically penetrating the insulator frame, the internal closed surface of the side wall of the shallow metal basin, and a plastic layer molded to cover the semiconductor device chip.

Referring to FIG. 5 for the third time, a semiconductor device chip 10 having at least one semiconductor device element disposed therein and plural bonding pads 13 arranged along the periphery thereof is adhered on the bottom surface of the bottom plate 8A of the shallow metal basin 8 produced employing a process described, referring to FIGS. 3 and 4. It is noted, however, the width of the flange 8B is as short as 0.2 through 0.3 mm, as is in the case of the second embodiment in which an insulator frame 12*a* referred to below is fitted to the side wall 8C of the shallow metal basin 8.

Referring to FIGS. 12 and 13 again, an insulator frame 12*a* made of a glass epoxy resin et al. having a pair of an upper metal piece 11*a* and a lower metal piece 11*a* connected with each other by a metal layer 11*b* lining a through-hole 11, is produced. The dimension of the internal closed surface of the insulator flange 12*a* is slightly less than that of the external closed surface of the side wall 8C of the shallow metal basin 8, because the shallow metal basin 8 is scheduled to be fitted to the insulator frame 12*a*. It is noted, however, the thickness of the insulator frame 12 is e.g. 1 mam or more.

Figure 20:
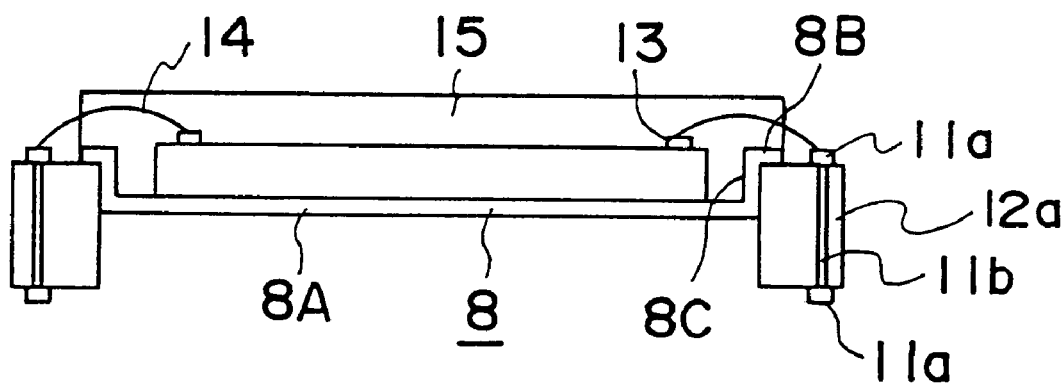
FIG. 20 is a cross section of a semiconductor device complex fitted to an insulator frame, the combination of a semiconductor device complex and an insulator frame being employable for producing a semiconductor device in accordance with the fifth embodiment of this invention.

Referring to FIG. 20, the shallow metal basin 8 is fitted to the insulator frame 12*a*, before a semiconductor device chip 10 is adhered on the bottom plate 8a of the shallow metal basin 8, a bonding process is conducted to connect each of the bonding pads 13 arranged on the semiconductor device chip 10 and each of the upper conductor pieces 11a of the external terminals each of which is further connected with each of the lower conductor pieces 11a connected by each of the metal layers 11b lining each of the through-holes, a screen printing process or the like is conducted to arrange a series of solder balls 16 to cause each of the solder balls 16 to contact with each of the bonding pads 11, and a molding process is conducted to cover the top surface of the semiconductor device chip 10 and the periphery thereof. It is noted that the lower ends of the insulator frame 12a push down beyond the rear surface of the bottom plate 8a of the shallow metal basin 8.

Figure 21:
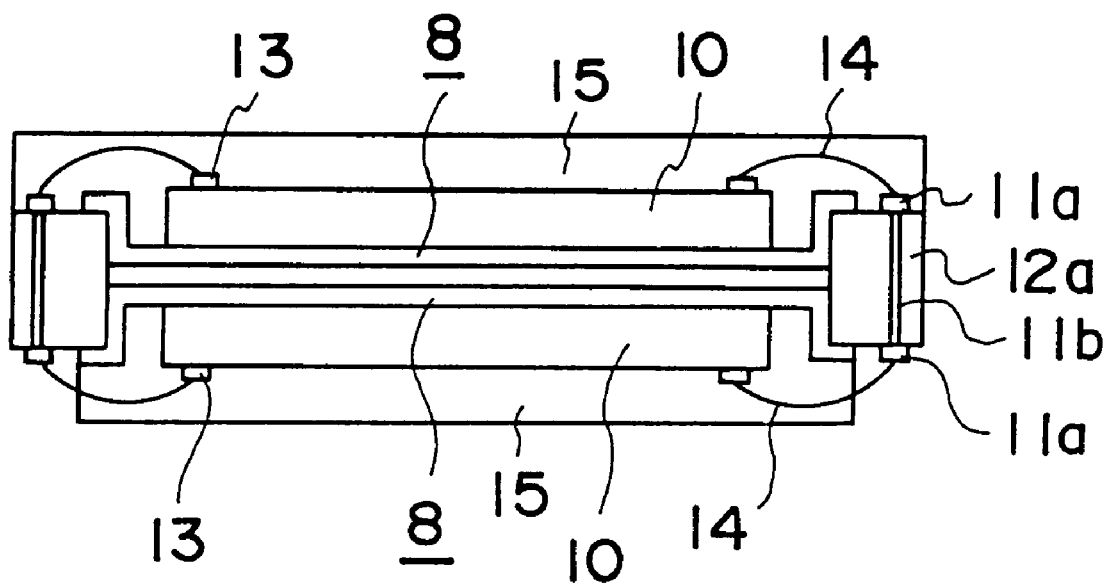
FIG. 21 is a cross section of a semiconductor device packaged in a chip scale package in accordance with the fifth embodiment of this invention.

Referring to FIG. 21, another shallow metal basin 8 on which a semiconductor device chip 10 is adhered, is fitted to the insulator frame 12. It is of course possible to fit a shallow metal basin 8 to an insulator frame 12a, before a semiconductor device chip 10 is adhered on the shallow metal basin 8. A bonding process is conducted to connect each of the bonding pads 13 arranged on the semiconductor device chip 10 and each of the upper conductor pieces 11a of the external terminals each of which is further connected with each of the lower conductor pieces 11a connected by each of the metal layers 11b lining each of the through-holes, a screen printing process or the like is conducted to arrange a series of solder balls 16 to cause each of the solder balls 16 to contact with each of the bonding pads 11, and a molding process is conducted to cover the top surface of the semiconductor device chip 10 and the periphery thereof.

In the foregoing manner, a semiconductor device in accordance with the fifth embodiment of this invention has been produced.

Figure 22:
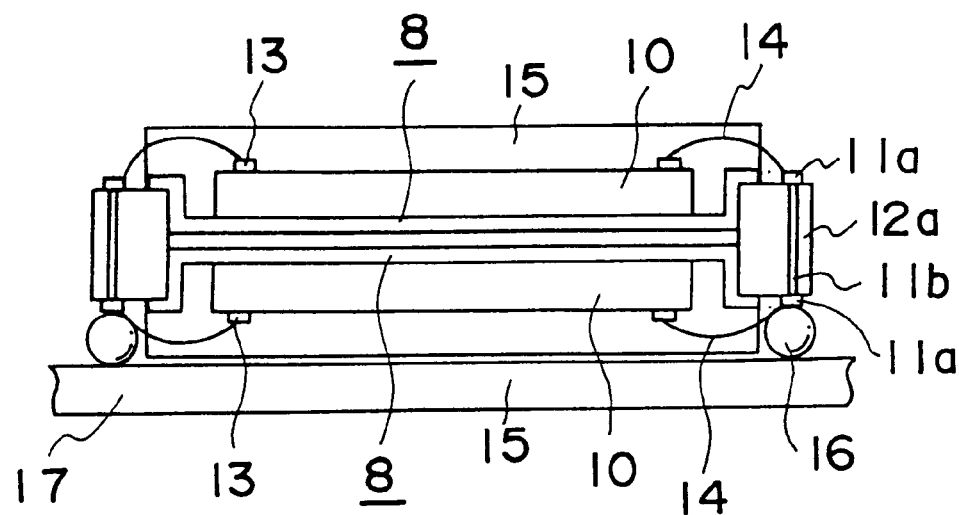
FIG. 22 is a cross section of a semiconductor device packaged in a chip scale package in accordance with the fifth embodiment of this invention, the semiconductor device being under a position in which it is put into practical services.

Referring to FIG. 22, when the semiconductor device in accordance with the fifth embodiment of this invention is put into practical services, the semiconductor device is placed on a printed circuit board 17 wherein each of the solder balls arranged along the bottom surface of the insulator frame 12a contacts each of the printed terminals of the printed circuit board 17. Similarly to the third embodiment, however, it is noted that the quantity of the external terminals is limited, excepting the cases in which the semiconductor device is a memory which can be a combination of parallel circuits.

SIXTH EMBODIMENT

A semiconductor device having a plurality of the semiconductor devices in accordance with the fifth embodiment of this invention, the semiconductor devices in accordance with the fifth embodiment being piled employing larger solder balls 16a which intervene between the lower member including two semiconductor device chips and the upper member including two semiconductor device chips as well.

Figure 23:
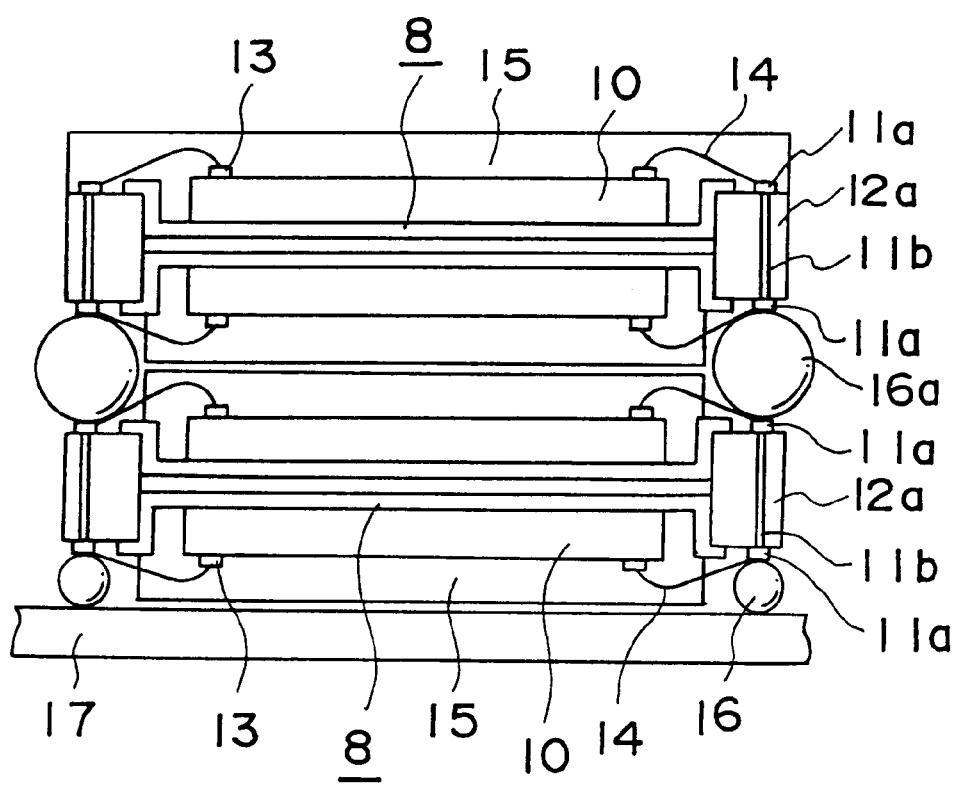
FIG. 23 is a cross section of a semiconductor device packaged in a chip scale package in accordance with the sixth embodiment of this invention.

Referring to FIG. 23, the semiconductor devices in accordance with the fifth embodiment and which is illustrated in FIG. 21 are piled employing larger solder balls 16a which intervene between the lower member including two semiconductor device chips and the upper member including two semiconductor device chips as well.

The foregoing problem regarding the quantity of the external terminals accompanies this embodiment as well.

SEVENTH EMBODIMENT

A semiconductor device including a semiconductor device in accordance with the fifth embodiment of this invention and at least one semiconductor device in accordance with the second embodiment of this invention which is piled on the foregoing semiconductor device in accordance with the fifth embodiment of this invention employing solder balls.

Figure 24:
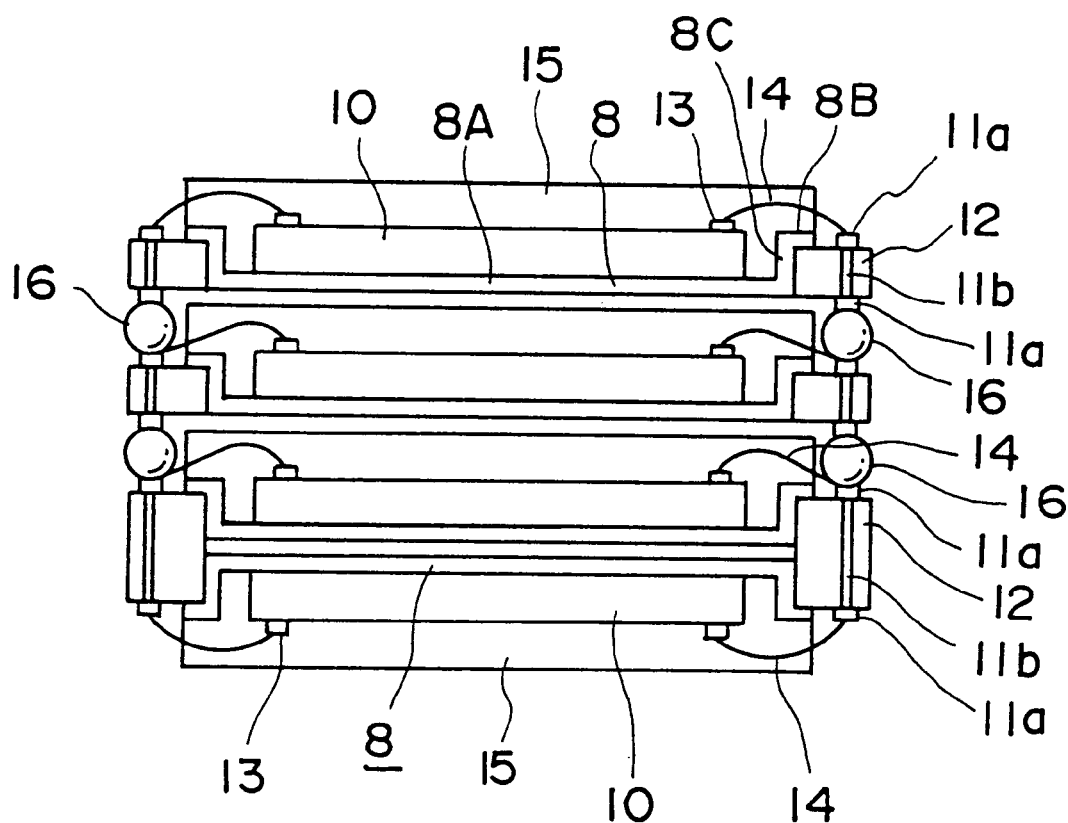
FIG. 24 is a cross section of a semiconductor device packaged in a chip scale package in accordance with the seventh embodiment of this invention.

Referring to FIG. 24, plural semiconductor devices (two semiconductor devices in the drawing) in accordance with the second embodiment of this invention illustrated in FIG. 14 are piled on a semiconductor device in accordance with the fifth embodiment of this invention illustrated in FIG. 21, employing solder balls 16a.

When it is put into practical services, the semiconductor device in accordance with the seventh embodiment of this invention is placed an a printed circuit board employing solder balls in a manner similar to that which was described above.

The foregoing description has clarified that this invention has successfully provided a variety of semiconductor devices packaged in a chip scale package wherein the production procedure is simple and the heat dissipation efficiency and the integration are remarkably improved, and a variety of methods for production thereof. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. A semiconductor device, comprising:
   a metal frame having first and second opposing surfaces, said metal frame having a recess formed in the first surface at a center portion thereof, said metal frame further having a protrusion in direct registration with the recess, the protrusion being formed in the second surface at a center portion thereof;
   a semiconductor chip located on the metal frame and being disposed within the recess, the semiconductor chip having a plurality of first pads;
   an insulator frame arranged to surround the protrusion, said insulator frame having first and second opposing surfaces, the first surface of said insulator frame being positioned against a peripheral portion of the second surface of said metal frame, the protrusion not protruding past the second surface of said insulator frame;
   a plurality of second pads positioned on the second surface of said insulator frame, each of said second pads being electrically connected to a corresponding one of said first pads; and
   a molding resin positioned above the recess and said semiconductor chip, and covering said semiconductor chip.

2. The semiconductor device according to claim 1, further comprising a plurality of ball electrodes, each ball electrode being positioned on a corresponding one of said second pads.

3. The semiconductor device according to claim 1, wherein the second surface of said insulator frame and the protrusion collectively form an essentially horizontal surface.

4. The semiconductor device according to claim 1, wherein said insulator frame extends beyond the protrusion, so that the second surface of said insulator frame and the protrusion collectively form a step.

5. The semiconductor device according to claim 1, further comprising a heat sink formed from a plurality of ball electrodes positioned on the protrusion.

6. The semiconductor device according to claim 2, further comprising a heat sink formed from a plurality of further ball electrodes positioned on the protrusion.

7. A semiconductor device arrangement, comprising:
   a first semiconductor device and a second semiconductor device, each said semiconductor device including:
   a metal frame having first and second opposing surfaces, said metal frame having a recess formed in the first surface at a center portion thereof, said metal frame further having a protrusion in direct registration with the recess, the protrusion being formed in the second surface at a center portion thereof;
   a semiconductor chip located on the metal frame and being disposed within the recess, the semiconductor chip having a plurality of first pads;
   an insulator frame arranged to surround the protrusion, said insulator frame having first and second opposing surfaces, the first surface of said insulator frame being positioned against a peripheral portion of the second surface of said metal frame, the protrusion not protruding past the second surface of said insulator frame;
   a plurality of second pads positioned on the second surface of said insulator frame, each of said second pads being electrically connected to a corresponding one of said first pads; and
   a molding resin positioned above the recess and said semiconductor chip, and covering said semiconductor chip;
   wherein said first semiconductor device has a plurality of third pads, each of which is positioned on said first surface of said insulator frame; and
   wherein said second semiconductor device includes a plurality of ball electrodes, each ball electrode being positioned on a corresponding one of said second pads of said second semiconductor device, each of said ball electrodes further being electrically connected to corresponding one of said third pads of said first semiconductor device.

8. A semiconductor device arrangement, comprising:
   a first semiconductor device and a second semiconductor device, each said semiconductor device including:
   a metal frame having first and second opposing surfaces, said metal frame having a recess formed in the first surface at a center portion thereof, said metal frame further having a protrusion in direct registration with the recess, the protrusion being formed in the second surface at a center portion thereof; and
   a semiconductor chip located on the metal frame and being disposed within the recess, the semiconductor chip having a plurality of first pads;
   an insulator frame arranged to surround each protrusion of said semiconductor devices, said insulator frame having first and second opposing surfaces;
   a plurality of second pads positioned on the first surface of said insulator frame, each of said second pads being electrically connected to a corresponding one of said first pads of said first semiconductor device;
   a plurality of third pads positioned on the second surface of said insulator frame, each of said third pads being electrically connected to a corresponding one of said first pads of said second semiconductor device; and
   a molding resin covering the recess and said semiconductor chip of each of said first semiconductor device and said second semiconductor device;
   wherein the center portion of the second surface of said metal frame of said first semiconductor device is positioned adjacent to the center portion of the second surface of said metal frame of said second semiconductor device; and wherein each of said third pads is electrically connected to a corresponding one of said second pads on said insulator frame.

9. The arrangement according to claim 8, further comprising a plurality of ball electrodes, each ball electrode being positioned on a corresponding one of said third pads.

10. The arrangement according to claim 8, wherein each of said third pads is electrically connected to the corresponding one of said second pads through one of a plurality of through holes, each of which is provided in said insulator frame.

* * * * *